(12) United States Patent
Choi et al.

(10) Patent No.: US 10,665,671 B2
(45) Date of Patent: May 26, 2020

(54) JUNCTIONLESS TRANSISTOR BASED ON VERTICALLY INTEGRATED GATE-ALL-ROUND MULTIPLE NANOWIRE CHANNELS AND METHOD OF MANUFACTURING THE SAME

(71) Applicant: Korea Advanced Institute of Science and Technology, Daejeon (KR)

(72) Inventors: Yang-Kyu Choi, Daejeon (KR); Byung-Hyun Lee, Daejeon (KR); Min-Ho Kang, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 15/428,727

(22) Filed: Feb. 9, 2017

(65) Prior Publication Data
US 2017/0236901 A1 Aug. 17, 2017

(30) Foreign Application Priority Data
Feb. 16, 2016 (KR) ........................ 10-2016-0017812

(51) Int. Cl.
*H01L 21/00* (2006.01)
*H01L 29/06* (2006.01)
(Continued)

(52) U.S. Cl.
CPC ...... *H01L 29/0673* (2013.01); *H01L 21/0274* (2013.01); *H01L 21/26513* (2013.01); *H01L 21/3065* (2013.01); *H01L 21/31055* (2013.01); *H01L 21/31111* (2013.01); *H01L 21/31116* (2013.01); *H01L 21/324* (2013.01); *H01L 29/42392* (2013.01); *H01L 29/66742* (2013.01);
(Continued)

(58) Field of Classification Search
CPC .......... H01L 29/0673; H01L 29/42392; H01L 29/66742; H01L 29/786; H01L 29/785; H01L 21/3065; H01L 21/324; H01L 21/0274; H01L 21/31116; H01L 21/31055; H01L 21/31111
See application file for complete search history.

(56) References Cited

U.S. PATENT DOCUMENTS 9,484,460 B2 * 11/2016 Colinge ............ H01L 29/66356
9,660,107 B1 * 5/2017 Colinge ................ H01L 29/792
(Continued)

*Primary Examiner* — Nicholas Tobergte
(74) *Attorney, Agent, or Firm* — Saliwanchik, Lloyd & Eisenschenk

(57) ABSTRACT

Disclosed is a method of manufacturing a junctionless transistor based on vertically integrated gate-all-around multiple nanowire channels including forming vertically integrated multiple nanowire channels in which a plurality of nanowires is vertically integrated, forming an interlayer dielectric layer (ILD) on the vertically integrated multiple nanowire channels, forming a hole in the interlayer dielectric layer such that at least some of the vertically integrated multiple nanowire channels is exposed, and forming a gate dielectric layer on the interlayer dielectric layer to fill the hole, wherein the forming of the gate dielectric layer on the interlayer dielectric layer to fill the hole includes depositing the gate dielectric layer on the interlayer dielectric layer to surround at least some of the vertically integrated multiple nanowire channels which is exposed though the hole.

14 Claims, 6 Drawing Sheets

(51) Int. Cl.
*H01L 29/423* (2006.01)
*H01L 21/3065* (2006.01)
*H01L 21/265* (2006.01)
*H01L 21/324* (2006.01)
*H01L 21/027* (2006.01)
*H01L 21/311* (2006.01)
*H01L 21/3105* (2006.01)
*H01L 29/66* (2006.01)
*H01L 29/786* (2006.01)
*H01L 29/78* (2006.01)

(52) U.S. Cl.
CPC ...... *H01L 29/66795* (2013.01); *H01L 29/785* (2013.01); *H01L 29/786* (2013.01)

(56) References Cited

U.S. PATENT DOCUMENTS

| | | | |
|---|---|---|---|
| 2010/0276662 A1* | 11/2010 | Colinge | B82Y 10/00 257/9 |
| 2011/0280076 A1* | 11/2011 | Samachisa | B82Y 10/00 365/185.17 |
| 2016/0043074 A1* | 2/2016 | Hurley | H01L 21/8258 257/351 |
| 2017/0162579 A1* | 6/2017 | Choi | H01L 27/10802 |

* cited by examiner

JUNCTIONLESS TRANSISTOR BASED ON VERTICALLY INTEGRATED GATE-ALL-ROUND MULTIPLE NANOWIRE CHANNELS AND METHOD OF MANUFACTURING THE SAME

CROSS-REFERENCE TO RELATED APPLICATIONS

This present application claims priority under 35 U.S.C. § 119 to Korean Patent Application No. 10-2016-0017812, filed Feb. 16, 2016, which is herein incorporated by reference in its entirety.

BACKGROUND

Embodiments of the inventive concept described herein relate to a junctionless transistor and a method of manufacturing the same, and more particularly, relate to a junctionless transistor based on vertically integrated gate-all-round multiple nanowire and a method of manufacturing the same.

A Moore's law is discovered in a semiconductor transistor, and through continuous scaling down, the semiconductor transistor has undergone lots of innovative evolution of scaling down technology which happened about 20 times over last 45 years. As a result, a gate length of a metal-oxide-semiconductor field-effect-transistor (MOSFET) is decreased by 70% every 2.5 years on average, and therefore the gate length decreased by one-four hundredth of an initial gate length over last 45 years.

Scaling down has continuously proceeded, a silicon technology begun to mass-produce transistors each of which had a gate length of less than 100 nm since 2000, and this meant that a nanoscale electronic device has begun. However, after this time, scale down has reached a plateau from time to time such that not only physical limitation of a manufacturing process was exposed, but also side effects were caused in terms of performance. A short channel effect (SCE) due to decrease of the gate length is a representative side effect. Although the extreme gate length of sub-10 nm is not reached, increase of off-state leakage current derived from the short channel effect prevents present and future MOSFET scale down.

A gate-all-around nanowire channel structure is evaluated as the most effective structure for preventing increase of leakage current derived from the short channel effect.

Hereupon, below embodiments provide a vertically integrated gate-all-around multiple nanowire field-effect transistor.

Most existing semiconductor transistors today are based on a junction. The junction allows flow and blocking of mobile charges to be easy, thereby functioning to strengthen a function of the semiconductor transistor. Accordingly, the junction has been considered as an essential component of a transistor. A junctionless transistor which has broken stereotypes of a conventional transistor has received a lot of attention from academic circles and industrial circles as a next-generation transistor, with development thereof, due to a simple manufacturing process and various advantages of operation.

However, absence of the junction requires superior gate controlling ability than the conventional junction-based transistor in terms of stable on-off switching. Namely, on-off switching depends on only the gate controlling ability without junction support. Meanwhile, development of a high-performance junctionless transistor has mainly focused on decrease of resistance of a channel which is a passage for electrons. To this end, a high-concentration channel ion implantation process has been applied. However, a scattering effect due to increased doping dopants causes performance degradation, thereby requiring a proper compromise with channel resistance. Basically, the best method for high-performance of the transistor is to increase a length of a channel region—there are no two ways about it. However, considering scalability and integration for continuous scale down and a gate controlling ability of the channel, the above method is not suitable. Accordingly, development of the junctionless transistor for the next generation electronics industry acutely requires excellent gate controlling ability, high performance, and optimization of superior scalability.

A vertically integrated gate-all-around multiple nanowire field-effect transistor is an optimum structure to satisfy excellent gate controlling ability, high performance, and high scalability. However, a conventional vertically integrated gate-all-around multiple nanowire field-effect transistor reduces completeness of the transistor due to complexity of a process in which a plurality of nanowires is vertically integrated and variability.

In detail, in the conventional vertically integrated gate-all-around multiple nanowire field-effect transistor, there are many problems, e.g. performance variability due to each shape and size ununiformity of the nanowires, difficulty of formation of the multiple nanowires which have uniform doping concentration using a source-drain ion implantation process and an annealing process, resistance ununiformity of source and drain electrodes and channel caused by the above problem, and sensitivity of transistor performance against a corner effect of the nanowire channel.

Accordingly, following embodiments provide a junctionless transistor based on a vertically integrated gate-all-around multiple nanowire channel which solves the problems of the conventional vertically integrated gate-all-around multiple nanowire field-effect transistor, and a method of manufacturing the same.

BRIEF SUMMARY

Embodiments of the inventive concept provide a junctionless transistor based on vertically integrated gate-all-around multiple nanowire channels, in which a plurality of nanowires is vertically integrated using a plasma-based one-route all-dry etching process, thereby having performance variability less sensitive to shape change of the nanowires, fundamentally solving process complexity of formation of source and drain electrodes and variability and instability of the performance due to the process complexity, and implementing low power, high performance, high integration, and low costs, and a method of manufacturing the same.

According to an aspect of an embodiment, a method of manufacturing a junctionless transistor based on vertically integrated gate-all-around multiple nanowire channels includes forming vertically integrated multiple nanowire channels in which a plurality of nanowires is vertically integrated, forming an interlayer dielectric layer (LLD) on the vertically integrated multiple nanowire channels, forming a hole in the interlayer dielectric layer to expose at least some of the vertically integrated multiple nanowire channels, and forming a gate dielectric layer on the interlayer dielectric layer to fill the hole, wherein the forming of the gate dielectric layer on the interlayer dielectric layer to fill the hole includes depositing the gate dielectric layer on the interlayer dielectric layer to surround at least some of the vertically integrated multiple nanowire channels exposed through the hole.

Forming the vertically integrated multiple nanowire channels in which a plurality of nanowires is vertically integrated may include implanting ions into a substrate, depositing an oxide layer on the substrate based on a shape of an active layer, and performing a plasma-based one-route all-dry etching process on the substrate using the oxide layer as a mask.

Performing the plasma-based one-route all-dry etching process on the substrate using the oxide layer as the mask may include forming a protection layer on the substrate through an anisotropic etching process using polymer and performing an isotropic etching process on the substrate using sulfur hexafluoride (SF6) gas.

Performing the isotropic etching process on the substrate using sulfur hexafluoride gas may include forming the nanowires which are supported by opposite ends of the substrate and float in air using an etching rate difference between a remaining region except for a region, in which the oxide layer is deposited, of an upper surface of the substrate and a side surface of the substrate.

Performing the plasma-based one-route all-dry etching process on the substrate using the oxide layer as the mask may include repetitively performing the plasma-based one-route all-dry etching process such that the vertically integrated multiple nanowire channels in which the plurality of nanowires is vertically integrated, is formed.

Implanting ions into the substrate may further include performing an annealing process on the substrate in which the ions are implanted, and depositing the oxide layer on the substrate based on the shape of the active layer may further include performing an exposure process based on positive photoresist to the substrate, on which the oxide layer is deposited, using the oxide layer as a mask.

Forming the vertically integrated multiple nanowire channels in which the plurality of nanowires is vertically integrated may include forming source and drain electrodes by implanting ions into a substrate.

Forming the interlayer dielectric layer on the vertically integrated multiple nanowire channels may further include performing an exposure process based on negative photoresist to the interlayer dielectric layer using a mask having the same shape as an active layer, performing a dry etching process on the interlayer dielectric layer to decrease height difference between the active layer and a non-active layer, and planarizing the interlayer dielectric layer through a chemical mechanical polishing process (CMP).

Forming the hole in the interlayer dielectric layer to expose the at least some of the vertically integrated multiple nanowire channels may include performing an exposure process and a dry etching process on the interlayer dielectric layer to form patterns which are disposed at opposite regions with respect to a central part of the vertically integrated multiple nanowire channels and have a predetermined depth and performing a wet etching process on the interlayer dielectric layer disposed between the patterns which have the predetermined depth to form the hole to expose the at least some of the vertically integrated multiple nanowire channels after the patterns which have the predetermined depth are merged.

Forming the hole in the interlayer dielectric layer to expose the at least some of the vertically integrated multiple nanowire channels may include leaving the interlayer dielectric layer between the substrate and the vertically integrated multiple nanowire channel, which is adjacent to the substrate, of the vertically integrated multiple nanowire channels.

Forming the gate dielectric layer on the interlayer dielectric layer to fill the hole may further include planarizing the gate dielectric layer through a chemical mechanical polishing process, performing an exposure process and a dry etching process on the gate dielectric layer to form a gate electrode, and performing an annealing process on the gate electrode.

According to another aspect of an embodiment, a junctionless transistor based on vertically integrated gate-all-around multiple nanowire channels includes source and drain electrodes, vertically integrated multiple nanowire channels, in which a plurality of nanowires is vertically integrated, formed between the source and drain electrodes, an interlayer dielectric layer (ILD) formed on the vertically integrated multiple nanowire channels, and a gate electrode formed to surround at least some of the vertically integrated multiple nanowire channels.

The vertically integrated multiple nanowire channels are formed through following processes, and the processes may include implanting ions into a substrate, depositing an oxide layer on the substrate based on a shape of an active layer, and performing a plasma-based one-route all-dry etching process on the substrate using the oxide layer as a mask.

Performing the plasma-based one-route all-dry etching process on the substrate using the oxide layer as the mask may include forming a protection layer on the substrate through an anisotropic etching process using polymer, and performing an isotropic etching process on the substrate using sulfur hexafluoride (SF6) gas. Performing the isotropic etching process on the substrate using sulfur hexafluoride gas may include forming the nanowires, which are supported by opposite ends of the substrate and float in air, using an etching rate difference between a region except for a region, in which the oxide layer is deposited, of an upper surface of the substrate and a side surface of the substrate.

BRIEF DESCRIPTION OF THE DRAWINGS

The above and other objects and features will become apparent from the following description with reference to the following figures, wherein like reference numerals refer to like parts throughout the various figures unless otherwise specified, and wherein.

DETAILED DESCRIPTION

Figure 1:
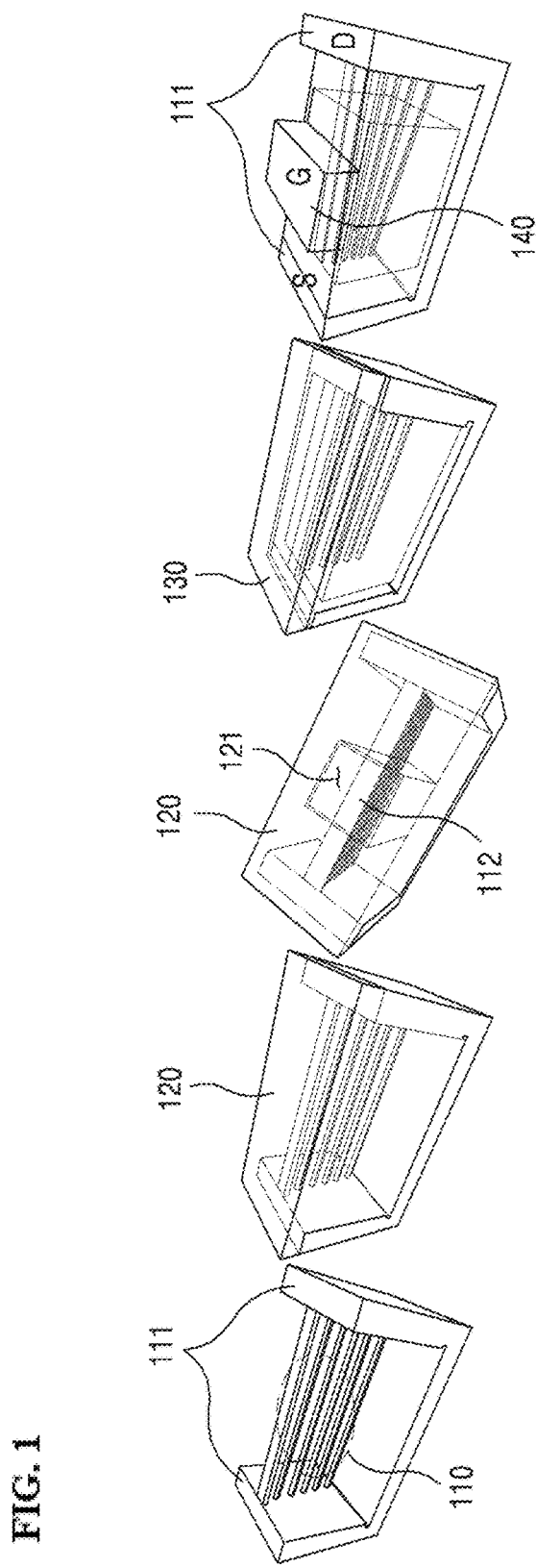
FIG. 1 is a view illustrating a method of manufacturing a junctionless transistor based on a vertically integrated gate-all-around multiple nanowire channels according to an embodiment.

Hereinafter, embodiments of the present disclosure will be described in conjunction with the accompanying drawings in detail. However, the present disclosure is not limited or restricted to the embodiments. With respect to the descriptions of the drawings, like reference numerals refer to like elements.

Furthermore, terminologies used herein are defined to appropriately describe the embodiments of the present disclosure and thus may be changed depending on a user, the intent of an operator, or a custom. Accordingly, the terminologies must be defined based on the following overall description of this specification.

FIG. 1 is a view illustrating a method of manufacturing a junctionless transistor based on vertically integrated gate-all-around multiple nanowire channels according to an embodiment.

Referring to FIG. 1, a junctionless transistor based on the vertically integrated gate-all-around multiple nanowire channels according to the embodiment is manufactured by a manufacturing system for the junctionless transistor based on the vertically integrated gate-all-around multiple nanowire channels (hereinafter, referred to as a "manufacturing system"). A detailed manufacturing method will be described below.

First, the manufacturing system may implant ions into a substrate to form channels 110. Herein, a boron-doped bulk silicon wafer may be used as the substrate. When n-type channels are formed, n-type ions may be implanted. When p-type channels are formed, p-type ions may be implanted. Furthermore, source and drain electrodes may be formed at opposite ends 111 of the substrate by ion implantation of the substrate.

In succession, to minimize damage of the substrate due to the ion implantation and to activate the ions, the manufacturing system may perform an annealing process on the substrate, into which the ions are implanted.

Then, the manufacturing system may deposit an oxide layer on the substrate based on a shape of an active layer. For example, the manufacturing system may deposit a high-density plasma (HDP) oxide layer on the substrate using plasma enhanced chemical vapor deposition (PECVD). Herein, since the oxide layer is deposited based on the shape of the active layer, the oxide layer may function as a mask to protect the active layer in a plasma-based one-route all-dry etching process, which will be described below.

In sequence, the manufacturing system may perform an exposure process based on positive photoresist (light-exposed regions are etched) to the substrate, on which the oxide layer is deposited, using the oxide layer as a mask. For example, the manufacturing system may perforin the exposure process using the positive photoresist based on a krypton fluoride (KrF) to the high-density plasma oxide layer.

Then, the manufacturing system may perform a plasma-based one-route all-dry etching process on the substrate using the oxide layer as a mask to form vertically integrated multiple nanowire channels 110 in which a plurality of nanowires is vertically integrated. A detailed description will be made with reference to FIG. 2.

Through the above-described processes, the manufacturing system may form the vertically integrated multiple nanowire channels 110, in which the nanowires are vertically integrated and which are supported by opposite ends 111 (the source and drain electrodes) in a floating state in air.

After forming the vertically integrated multiple nanowire channels 110, for electrical isolation between transistors, the manufacturing system forms an interlayer dielectric layer (ILD) 120 on the vertically integrated multiple nanowire channels 110. For example, the manufacturing system may deposit tetraethyl orthosilicate (TEOS) as the interlayer dielectric layer 120 on the vertically integrated multiple nanowire channels 110 using a low-pressure chemical vapor deposition (LPCVD).

Herein, in a process of manufacturing the junctionless transistor based on the vertically integrated multiple nanowire channels 110, it is difficult to perform a chemical mechanical polishing (CMP) directly, since there is a height difference between the active region and a non-active region due to height of the vertically integrated nanowire channels 110 which are formed already (e.g. height of the vertically integrated multiple nanowire channels which are vertically stacked in five stages is 1 um or more). Accordingly, the manufacturing system may perform an exposure process on the interlayer dielectric layer 20 based on negative photoresist (light-exposed regions remain) using a mask which has the same shape as the active layer. After performing a dry etching process on the interlayer dielectric layer 120 to decrease the height difference between the active layer and the non-active layer, the interlayer dielectric layer 120 may be planarized through a chemical mechanical polishing process.

After forming the interlayer dielectric layer 120 on the vertically integrated multiple nanowire channels 110, the manufacturing system forms a hole 121 in the interlayer dielectric layer 120 to expose at least some of the vertically integrated nanowire channels 110. In detail, the manufacturing system may perform an exposure process and a dry etching process such that patterns each having a predetermined depth at opposite regions with respect to a central part of the vertically integrated multiple nanowire channels 110, are formed. For example, after the manufacturing system forms rectangular patterns at opposite regions with respective to the central part of the vertically integrated multi nanowire channels 110 through an exposure process based on a KrF laser, the interlayer dielectric layer may be etched through a dry etching process on form the rectangular patterns each of which has the predetermined depth. Then, the patterns each of which has the predetermined depth are merged such that the manufacturing system may perform a wet etching process on the interlayer dielectric layer 120, which is disposed between the patterns each having the predetermined depth, to form the hole 121.

As a result, at least some of the vertically integrated multiple nanowire channels 110, which will be a channel region, may be exposed through the hole 121 having a single rectangular pattern, which is formed by removal of the interlayer dielectric layer 120. Particularly, in this process, the manufacturing system may leave the interlayer dielectric layer 120 between the substrate and the nanowire channel, which is adjacent to the substrate, of the vertically integrated multiple nanowire channels 110. This is because the interlayer dielectric layer 120 remaining between the nanowire channel adjacent to the substrate and the substrate functions to block a passage for unwanted leakage current below the nanowire channel. Accordingly, each etching rate in the above-described dry etching process and wet etching process may be adjusted to leave the interlayer dielectric layer 120 which is disposed between the nanowire channel adjacent to the substrate and the substrate.

After forming the hole 121 in the interlayer dielectric layer 120, the manufacturing system forms a gate dielectric layer 130 on the interlayer dielectric layer 120 to fill the hole 121. That is, the manufacturing system may deposit the gate dielectric layer 130 on the interlayer dielectric layer 120 to surround at least some of the vertically integrated multiple nanowire channels 110 exposed through the hole 121. For example, the manufacturing system may deposit polysilicon on the interlayer dielectric layer 120 using a thermal oxidation process and a low-pressure chemical vapor deposition process. There is no time delay between thermal oxidation process and the low-pressure chemical vapor deposition process.

Then, after planarizing the gate dielectric layer 130 through a chemical mechanical polishing process, the manufacturing system may perform an exposure process and a dry etching process on the gate dielectric layer 130, thereby forming a gate electrode 140 on the gate dielectric layer 130. Furthermore, the manufacturing system may perform a forming gas annealing (FGA) process on the gate electrode 140 to improve interfacial property. In addition, the manufacturing system may remove an oxide layer on the active layer for smoothly electric measurement.

Herein, in a conventional manufacturing process of the junction-based vertically integrated multiple nanowires transistor, a source-drain ion implantation process is additionally performed to form the source and drain electrodes. Herein, in the source-drain ion implantation process, a high-energy ion implantation is required for the multiple nanowires having various depths. Accordingly, when the gate electrode does not properly protect the channel region because of the high-energy ion implantation, it is impossible to perform a normal MOSFET operation by direct current flow between the source and drain electrodes (a short circuit between the source and drain electrodes). To prevent this, in the conventional manufacturing process of the junction-based vertically integrated multiple nanowires transistor, deposition of a nitride layer and a high-density plasma oxide layer is additionally performed to protect the channel region when the high-energy ions are implanted into the planarized gate dielectric layer.

However, in the manufacturing system according to the embodiment, since the source and drain electrodes are formed already in an initial process in which ions are implanted into the substrate, as described above, an additional formation process for the source and drain electrodes is unnecessary.

Figure 2:
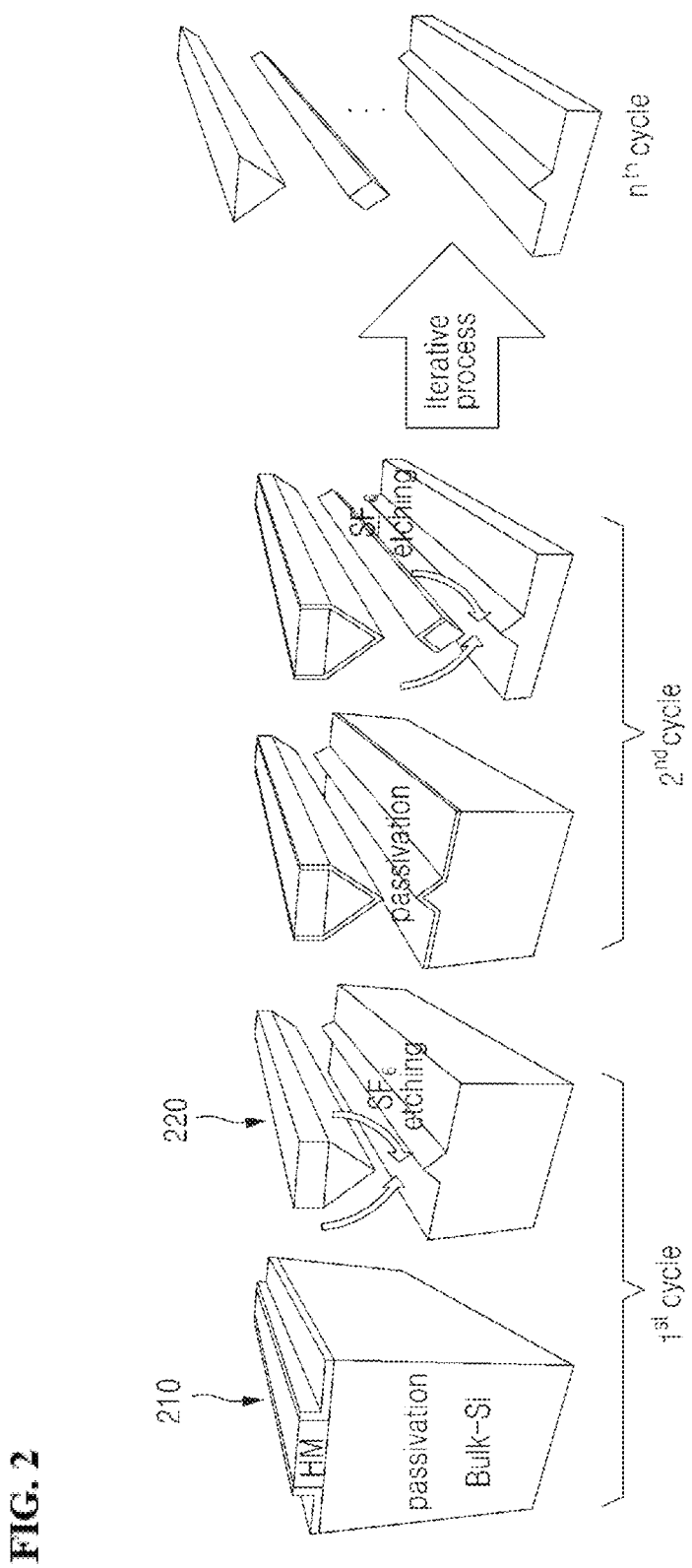
FIG. 2 is a view illustrating a plasma-based one-route all-thy etching process illustrated in FIG. 1 in detail.

FIG. 2 is a view illustrating the plasma-based one-route all-dry etching process described in FIG. 1 in detail.

Referring to FIG. 2, the manufacturing system performs the plasma-based one-route all-dry etching process on the substrate using the oxide layer, which is described in FIG. 1, as a mask such that the vertically integrated multiple nanowire channels in which a plurality of nanowires is vertically integrated are formed. Herein, the plasma-based one-route all-dry etching process controls process parameters within a reactive ion etching process, thereby being optimized to form the vertically integrated multiple nanowire channels.

In detail, after the manufacturing system performs an anisotropic etching process on the substrate using polymer such as octafluorocyclobutane (C4F8) to form a passivation layer (a first step) 210, an isotropic etching process is performed to the substrate using sulfur hexafluoride (SF6) gas (a second step) 220. One cycle includes the first step 210 and the second step 220, and the cycle is repeatedly performed. Thereby, the vertically integrated multiple nanowire channels in which a plurality of nanowires is vertically integrated may be formed. Herein, the number of repeated cycles may be identical to the number of nanowires included in the vertically integrated nanowire channels.

For example, in the manufacturing system, the substrate may be protected by a protection layer, which is formed through an anisotropic etching process using a polymer and an isotropic etching process may be performed to the substrate using sulfur hexafluoride gas. Although the protection layer protects the entire upper surface of the substrate, it is shown that a remaining region except for a region (which is indicated to a hard mask (HM) in FIG. 2), on which the oxide layer (which is deposited in advance to function as a mask) is formed, has a higher etch rate than a side surface of the substrate, due to feature of straight of plasma ions. Accordingly, although etching of the remaining region except for the region, on which the oxide layer is deposited, of the substrate is finished, the side surface of the substrate may be not completely etched.

By using an etching rate difference between the remaining region except for the region, on which the oxide layer is deposited, of the upper surface of the substrate and the side surface of the substrate, the nanowires may be formed to be supported by opposite ends of the substrate while floating in air. The manufacturing system repeatedly performs a formation process of the nanowires, which are supported by opposite ends of the substrate while floating in air, such that the vertically integrated multiple nanowire channels in which a plurality of nanowires is vertically integrated may be formed.

The plasma-based one-route all-dry etching process does not include a formation process of repeated oxide layers for a gap and a sequential wet etching process, thereby obtaining process simplification and forming the stable vertically integrated multiple nanowire channels without concern of stiction.

Figure 3:
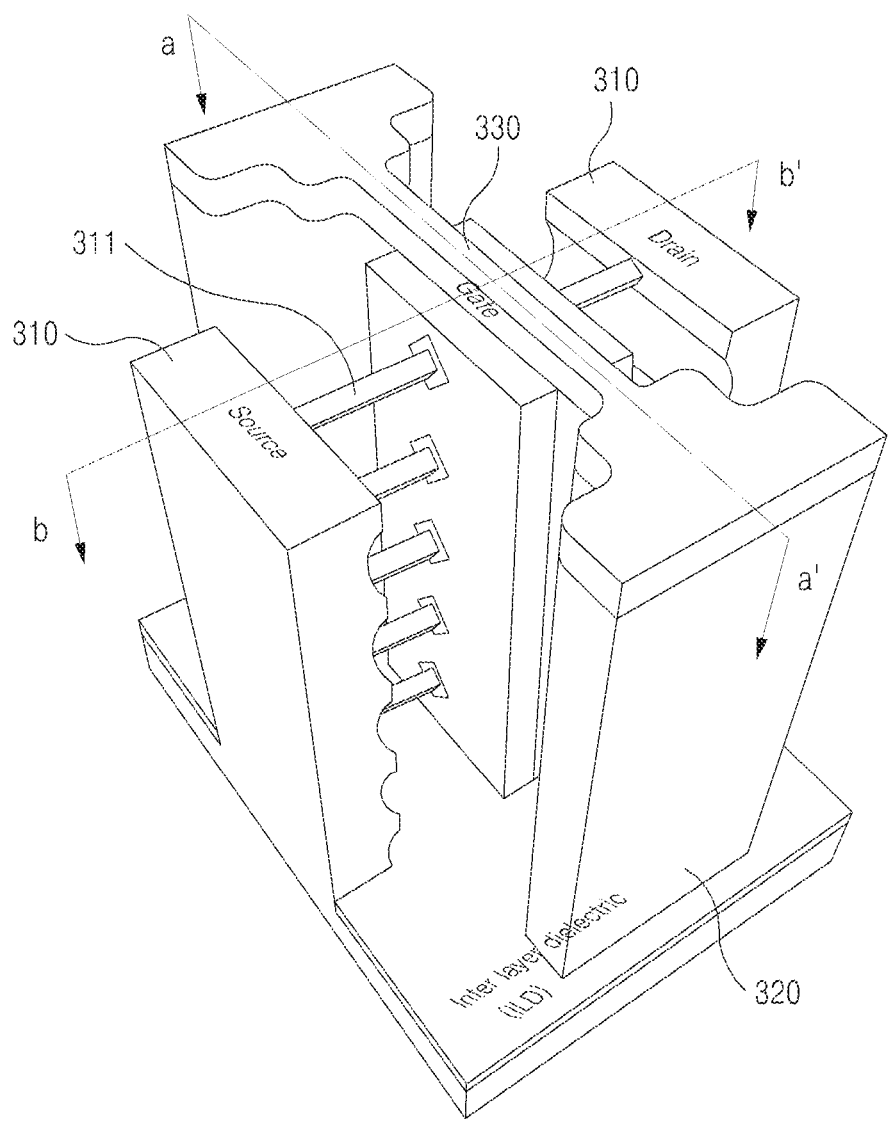
FIG. 3 is a view illustrating a junctionless transistor based on a vertically integrated gate-all-around multiple nanowire channels through the method illustrated in FIG. 1.

FIG. 3 is a view illustrating a junctionless transistor based on the vertically integrated gate-all-around multiple nanowire channels manufactured though the method illustrated in FIG. 1.

Referring to FIG. 3, the junctionless transistor including the vertically integrated gate-all-around multiple nanowire channels according to the embodiment includes source and drain electrodes 310, vertically integrated nanowire channels 311, an interlayer dielectric layer 320, and a gate electrode 330. Herein, the vertically integrated multiple nanowire channels 311, in which a plurality of nanowires is vertically integrated, are formed between the source and drain electrodes 310 using a plasma-based one-route all-dry etching process.

The junctionless transistor including the vertically integrated gate-all-around multiple nanowire channels, which are manufactured through the processes described with reference to FIGS. 1 and 2, may solve problems of the conventional junction-based multiple nanowire transistor.

For example, a conventional junction-based multiple nanowires transistor in which a plurality of nanowires is horizontally arranged causes expandability and decrease of integration due to increase of transistor size. However, the junctionless transistor based on the vertically integrated gate-all-around multiple nanowire channels according to the embodiment maintains integration and expandability without increase of area in comparison with a transistor including single nanowire channel, while improving current drive efficiency, namely performance, due to increase of the number of channels.

Alternatively, in a conventional junction-based vertically integrated multiple nanowires transistor in which a plurality of nanowires is vertically integrated, there are problems of advanced manufacturing process due to height difference of the vertically integrated multiple nanowires and poor reliability on transistor performance due to variability of the associated important parameters (e.g. resistance ununiformity of the nanowires due to the source-drain ion implantation process and a post annealing process). However, the junctionless transistor based on the vertically integrated gate-all-round multiple nanowire channels forms the vertically integrated multiple nanowire channels 311, in which a plurality of nanowires is vertically integrated, using the plasma-based one-route all-dry etching process, without the junction, thereby having the performance variability less sensitive to shape change of the nanowires, fundamentally solving complexity of the process of formation of the source and drain electrodes and the associated performance variability and instability, and implementing low power, high performance, high integration, and low costs.

Particularly, in the junctionless transistor based on the vertically integrated gate-all-round multiple nanowire channels according to the embodiment, since electrons move through a central part of the nanowires, instead of the surfaces of the nanowires, the junctionless transistor based on the vertically integrated gate-all-round multiple nanowire channels has performance variability less sensitive to shape change of the nanowires (having high tolerance to a corner effect).

The junctionless transistor based on the vertically integrated gate-all-round multiple nanowire channels and the method of manufacturing the same according to the embodiment may be ultimately used in a semiconductor process for development of high-integrated massive memory.

Figure 4:
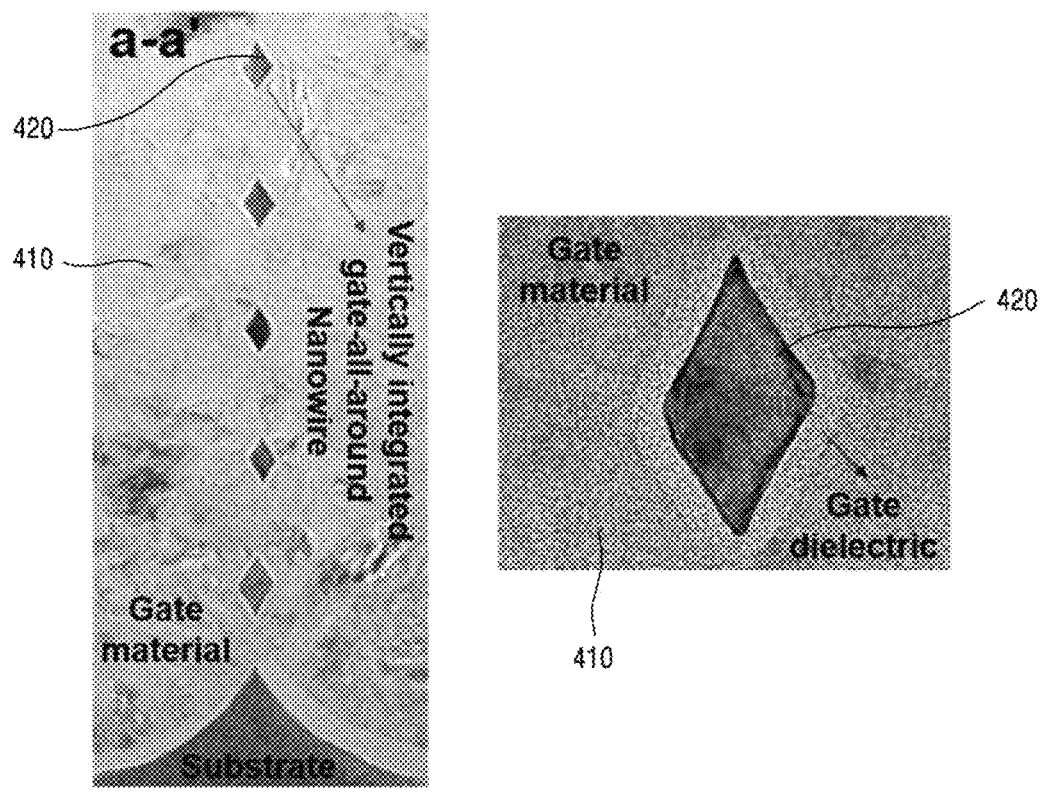
FIG. 4 is a transmission microscope picture which is a cross-sectional view taken along a-a' and the junctionless transistor based on the vertically integrated gate-all-around multiple nanowire channels illustrated in FIG. 3, and a transmission microscope picture of the enlarged cross-sectional view.

FIG. 4 is a transmission microscope picture which is a cross-sectional view taken along a-a' and the junctionless transistor based on the vertically integrated gate-all-around multiple nanowire channels illustrated in FIG. 3 and a transmission microscope picture of the enlarged cross-sectional view.

Referring to FIG. 4, since a gate dielectric layer 410 included in the junctionless transistor based on the vertically integrated gate-all-around multiple nanowire channels surrounds the vertically integrated multiple nanowire channels 420, the junctionless transistor based on the vertically integrated gate-all-round multiple nanowire channels may have a gate-all-around structure.

Figure 5:
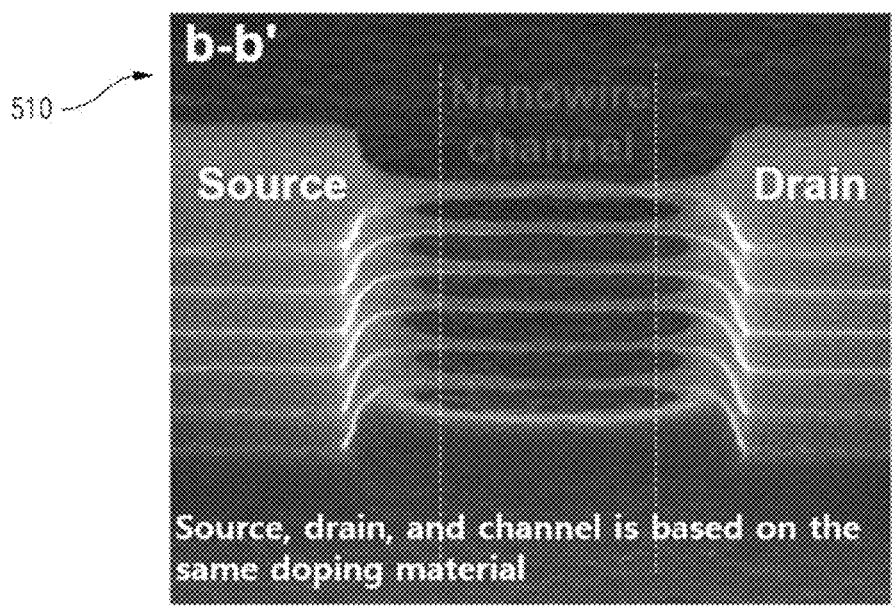
FIG. 5 is a scanning microscope picture which is a cross-sectional view taken along b-b' of FIG. 3 and shows the junctionless transistor based on the vertically integrated gate-all-around multiple nanowire channels, and a view illustrating metal-oxide-semiconductor field-effect transistors based on the presence or absence of a junction.
Figure 5:
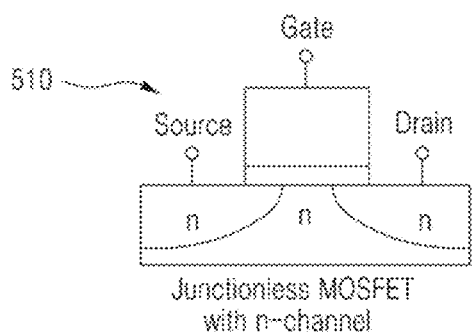
Figure 5:
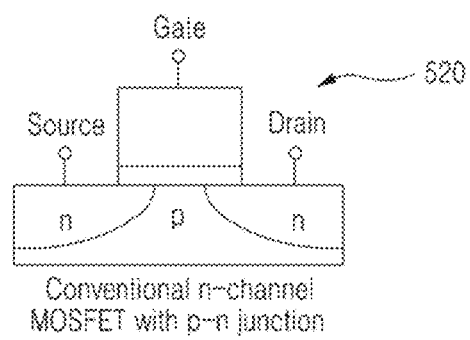

FIG. 5 is a scanning microscope picture which is a cross-sectional view taken along b-b' of FIG. 3 and shows the junctionless transistor based on the vertically integrated gate-all-around multiple nanowire channels, and a view illustrating a metal-oxide-semiconductor field-effect transistor based on the presence or absence of a junction.

Referring to FIG. 5, source and drain electrodes and a channel region, included in a junctionless transistor 510 based on the vertically integrated gate-all-round multiple nanowire channels according to the embodiment, are doped with identical dopants (e.g. n-type phosphorus).

In contrast, a conventional junction-based metal-oxide-semiconductor field-effect transistor 520 includes a junction which is based on different conductive-type dopants between the source and drain electrodes, and the channel region (e.g. the source and drain electrodes are doped with n-type phosphorous and the channel region is doped with p-type boron). Accordingly, in conventional junction-based metal-oxide-semiconductor field-effect transistor 520, a source-drain ion implantation process and a post annealing process are performed after formation of a gate electrode. For example, in the case of an n-type MOSFET, when phosphorous is implanted into the source and drain electrodes, a region below the gate electrode, which will be the channel region, is blocked by the gate electrode, such that the region below the gate electrode maintains p-type boron, which is an initial state of a wafer. Then, an annealing process is performed to cure physical damage due to the ion implantation process and to activate the dopants. In this process, a sufficient annealing condition is required to satisfy curing and activation. In the case in which a gate length is decreased, namely, in the case of an extreme short channel device, a central p-type region as well as the source and drain electrodes may be changed to an n-type phosphorous since the dopants are diffused by the annealing process. As a result, in the conventional junction-based metal-oxide-semiconductor field-effect transistor 520 which is operated by an inversion layer mode, it is impossible to operate on-off switching. The above defect is worse in the case of the vertically integrated multiple nanowire channels transistor which requires high-ion implantation energy due to height difference of the vertically integrated multiple nanowire channels, thereby preventing miniaturization of the device.

However, in the junctionless transistor 510 based on the vertically integrated gate-all-around multiple nanowire channels according to the embodiment, an n-type ion implantation process (a channel ion implantation process) is performed into an initial substrate, on which no pattern is formed, and a proper annealing process is performed. Accordingly, in the junctionless transistor 510 based on the vertically integrated gate-all-around multiple nanowire channels, since no pattern is formed, a post-annealing process may be not limited and therefore the gate length may be extremely decreased.

Figure 6:
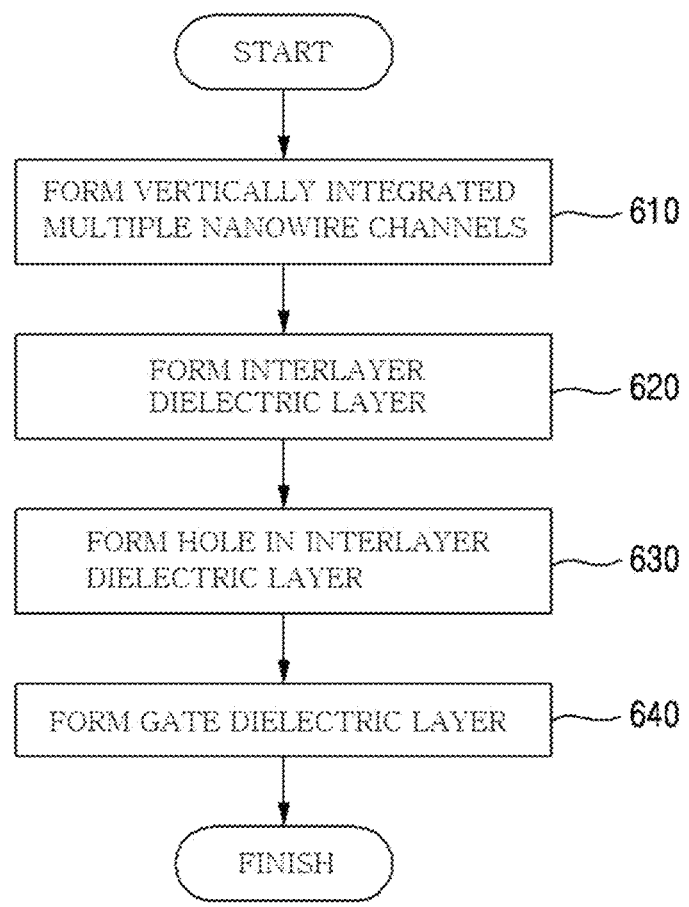
FIG. 6 is a flowchart illustrating a method of manufacturing a junctionless transistor based on a vertically integrated gate-all-around multiple nanowire channels according to an embodiment.

FIG. 6 is a flowchart illustrating a method of manufacturing a junctionless transistor based on a vertically integrated gate-all-around multiple nanowire channels according to an embodiment.

Referring to FIG. 6, the method of manufacturing the junctionless transistor based on the vertically integrated gate-all-around multiple nanowire channels according to the embodiment may be performed by a manufacturing system for a junctionless transistor based on the vertically integrated gate-all-around multiple nanowire channels (hereinafter, referred to as a "manufacturing system"). A detailed manufacturing method will be described below.

In operation 610, the manufacturing system forms a vertically integrated multiple nanowire channels in which a plurality of nanowires is vertically integrated.

In detail, in operation 610 of the manufacturing system, ions are implanted into a substrate, an oxide layer is deposited based on a shape of an active layer on the substrate, and a plasma-based one-route all-dry etching process is performed to the substrate using the oxide layer as a mask, and therefore the vertically integrated multiple nanowire channels may be formed.

Herein, after the manufacturing system performs an anisotropic etching process on the substrate using polymer to form a protection layer, and an isotropic etching process to the substrate using sulfur hexafluoride SF6 gas, the plasma-based one-route all-dry etching process may be performed to the substrate using the oxide layer as a mask. Herein, as a result of performance of the isotropic etching process, the nanowires may be formed using an etching rate difference between a remaining region except for a region, on which the oxide layer is deposited, of an upper surface of the substrate and a side surface of the substrate, thereby being supported by opposite ends of the substrate while floating in air.

Particularly, the manufacturing system repetitively performs the plasma-based one-route all-dry etching process, as described above, such that the vertically integrated multiple nanowire channels in which a plurality of nanowires is vertically integrated may be formed.

Furthermore, in the ion implantation process of the substrate, the manufacturing system may additionally perform an annealing process on the substrate, into which the ions are implanted. In the deposition process of the oxide layer based on the shape of the active layer on the substrate, an exposure process based on positive photoresist may be additionally performed to the substrate using the oxide layer as a mask.

In addition, in the ion implantation process of the substrate, as a result of ion implantation to the substrate, source and drain electrodes may be formed.

In sequence, in operation 620, the manufacturing system forms an interlayer dielectric layer (MD) on the vertically integrated multiple nanowire channels.

Herein, in operation 620 of the manufacturing system, an exposure process based on negative photoresist may be performed to the interlayer dielectric layer using a mask having the same shape as the active layer, a dry etching process may be performed to the interlayer dielectric layer to decrease height difference between the active layer and the non-active layer, and the interlayer dielectric layer may be planarized through a chemical mechanical polishing (CMP).

Then, in operation 630, the manufacturing system forms a hole in the interlayer dielectric layer to expose at least some of the vertically integrated nanowire channels.

In detail, in operation 630 of the manufacturing system, an exposure process and a dry etching process may be performed to the interlayer dielectric layer to form patterns which are disposed at opposite regions with respect to a central part of the vertically integrated multiple nanowire channels and have a predetermined depth, and the patterns having the predetermined depth are merged such that a wet etching process may be performed to the interlayer dielectric layer disposed between the patterns having the predetermined depth to form the hole which exposes at least some of the vertically integrated multiple nanowire channels.

Herein, in the dry etching process and/or the wet etching process, the interlayer dielectric layer between substrate and the nanowire channel, which is adjacent to the substrate, of the vertically integrated multiple nanowire channels may remain.

In succession, in operation 640, the manufacturing system forms a gate dielectric layer on the interlayer dielectric layer to fill the hole. Namely, in operation 640 of the manufacturing system, the gate dielectric layer may be deposited on the interlayer dielectric layer to surround at least some of the vertically integrated multiple nanowire channels which are exposed through the hole.

Furthermore, in operation 640 of the manufacturing system, the gate dielectric layer may be planarized through a chemical mechanical polishing process, an exposure process and a dry etching process may be performed to the gate dielectric layer to form a gate electrode, and an annealing process may be performed to the gate electrode.

As is apparent from the above description, according to the present disclosure, embodiments may provide the junctionless transistor based on the vertically integrated gate-all-around multiple nanowire channels, in which a plurality of nanowires is vertically integrated using the plasma-based one-route all-dry etching process, thereby having performance variability less sensitive to shape change of the nanowires, fundamentally solving process complexity of formation of the source and drain electrodes and variability and instability due to the process complexity, and implementing low power, high performance, high integration, and low costs, and the method of manufacturing the same.

In detail, in the conventional junction-based transistor, since electrons move through the surfaces of nanowires, the conventional junction-based transistor has performance variability sensitive to shape change (a shape of a corner on which the electric field due to the gate is concentrated) of the nanowires. However, in the embodiments, the junctionless-based vertically integrated multiple nanowire channels in which a plurality of nanowires is vertically integrated is formed using the plasma-based one-route all-dry etching process such that the junctionless transistor based on the vertically integrated multiple nanowire channels having performance variability less sensitive to shape change of the nanowires since electrons move through the central part of the nanowires instead of the surfaces of the nanowires, and the method of manufacturing the same may be provided.

Furthermore, in embodiments, since junctionless-based vertically integrated multiple nanowire channels in which a plurality of nanowires is vertically integrated are formed using the plasma-based one-route all-dry etching process, an additional process for formation of source and drain electrodes is omitted. Therefore, the junctionless transistor based on the vertically integrated gate-all-around multiple nanowire channels which fundamentally solves process complexity of formation of the source and drain electrodes and variability and instability due to the process complexity, and the method of manufacturing the same may be provided.

In addition, in embodiments, the junctionless transistor adopts a three-dimensional structure based on the vertically integrated gate-all-around multiple nanowire channels such that leakage current derived from the short channel effect is prevented, thereby implementing low power, high performance, high integration, and low costs. Therefore, the junctionless transistor and the method of manufacturing the same may be provided.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method of manufacturing a junctionless transistor based on vertically integrated gate-all-around multiple nanowire channels, the method comprising:
    forming vertically integrated multiple nanowire channels in which a plurality of nanowires is vertically integrated;
    forming an interlayer dielectric layer (ILD) on the vertically integrated multiple nanowire channels;
    forming a hole in the interlayer dielectric layer such that at least some of the vertically integrated multiple nanowire channels is exposed; and
    forming a gate dielectric layer on the interlayer dielectric layer to fill the hole,
    wherein the forming of the gate dielectric layer on the interlayer dielectric layer to fill the hole comprises depositing the gate dielectric layer on the interlayer dielectric layer to surround at least some of the vertically integrated multiple nanowire channels which is exposed though the hole.

2. The method of claim 1, wherein the forming the vertically integrated multiple nanowire channels in which the plurality of nanowires is vertically integrated comprises:
implanting ions into a substrate;
depositing an oxide layer on the substrate based on a shape of an active layer; and
performing a plasma-based one-route all-dry etching process on the substrate using the oxide layer as a mask.

3. The method of claim 2, wherein the performing of the plasma-based one-route all-dry etching process on the substrate using the oxide layer as the mask comprises:
forming a protection layer on the substrate through an anisotropic etching process using polymer; and
performing an isotropic etching process on the substrate using sulfur hexafluoride (SF6) gas.

4. The method of claim 3, wherein the performing of the isotropic etching process on the substrate using sulfur hexafluoride gas comprises:
forming the nanowires which are supported by opposite ends of the substrate and float in air, using an etching rate difference between a remaining region except for a region, in which the oxide layer is deposited, of an upper surface of the substrate and a side surface of the substrate.

5. The method of claim 3, wherein the performing of the plasma-based one-route all-dry etching process on the substrate using the oxide layer as the mask comprises:
repetitively performing the plasma-based one-route all-dry etching process such that the vertically integrated multiple nanowire channels, in which the plurality of nanowires is vertically integrated, are formed.

6. The method of claim 2, wherein the implanting of the ions into the substrate further comprises:
performing an annealing process on the substrate in which the ions are implanted, and
wherein the depositing of the oxide layer on the substrate based on the shape of the active layer further comprises:
performing an exposure process based on positive photoresist to the substrate, on which the oxide layer is deposited, using the oxide layer as a mask.

7. The method of claim 1, wherein the forming of the vertically integrated multiple nanowire channels in which the plurality of nanowires is vertically integrated comprises:
forming source and drain electrodes by implanting ions into a substrate.

8. The method of claim 1, wherein the forming of the interlayer dielectric layer on the vertically integrated multiple nanowire channels further comprises:
performing an exposure process based on negative photoresist to the interlayer dielectric layer using a mask having the same shape as an active layer;
performing a dry etching process on the interlayer dielectric layer for a decrease in a height difference between the active layer and a non-active layer; and
planarizing the interlayer dielectric layer through a chemical mechanical polishing process (CMP).

9. The method of claim 1, wherein the forming of the hole in the interlayer dielectric layer to expose the at least some of the vertically integrated multiple nanowire channels comprises:

performing an exposure process and a dry etching process on the interlayer dielectric layer to form patterns which are disposed at opposite regions with respective to a central part of the vertically integrated multiple nanowire channels and have a predetermined depth; and
performing a wet etching process on the interlayer dielectric layer disposed between the patterns which have the predetermined depth to form the hole to expose the at least some of the vertically integrated multiple nanowire channels after the patterns which have the predetermined depth are merged.

10. The method of claim 9, wherein the forming of the hole in the interlayer dielectric layer to expose the at least some of the vertically integrated multiple nanowire channels comprises:
leaving the interlayer dielectric layer between the substrate and the vertically integrated multiple nanowire channel, which is adjacent to the substrate, of the vertically integrated multiple nanowire channels.

11. The method of claim 1, wherein the forming of the gate dielectric layer on the interlayer dielectric layer to fill the hole further comprises:
planarizing the gate dielectric layer through a chemical mechanical polishing process;
performing an exposure process and a dry etching process on the gate dielectric layer to form a gate electrode; and
performing an annealing process on the gate electrode.

12. A junctionless transistor based on vertically integrated gate-all-around multiple nanowire channels, the junctionless transistor comprising:
source and drain electrodes;
vertically integrated multiple nanowire channels formed by vertically integrating a plurality of nanowires between the source and drain electrodes;
an interlayer dielectric layer (ILD) formed on the vertically integrated multiple nanowire channels; and
a gate electrode formed to surround at least some of the vertically integrated multiple nanowire channels.

13. The junctionless transistor of claim 12, wherein the vertically integrated multiple nanowire channels are formed through following processes, and
wherein the processes comprise:
implanting ions into a substrate;
depositing an oxide layer on the substrate based on a shape of an active layer; and
performing a plasma-based one-route all-dry etching process on the substrate using the oxide layer as a mask.

14. The functionless transistor of claim 13, wherein the performing of the plasma-based one-route all-dry etching process on the substrate using the oxide layer as the mask comprises:
forming a protection layer on the substrate through an anisotropic etching process using polymer; and
performing an isotropic etching process on the substrate using sulfur hexafluoride (SF6) gas, and
wherein the performing of the isotropic etching process on the substrate using sulfur hexafluoride gas comprises:
forming the nanowires, which are supported by opposite ends of the substrate and float in air, using an etching rate difference between a remaining region except for a region, in which the oxide layer is deposited, of an upper surface of the substrate and a side surface of the substrate.

* * * * *